United States Patent
Moon (10) Patent No.: US 8,156,462 B2
(45) Date of Patent: Apr. 10, 2012

(54) VERIFICATION TECHNIQUE INCLUDING DERIVING INVARIANTS FROM CONSTRAINTS

(75) Inventor: In-Ho Moon, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 716 days.

(21) Appl. No.: 12/243,821

(22) Filed: Oct. 1, 2008

(65) Prior Publication Data
US 2010/0083201 A1   Apr. 1, 2010

(51) Int. Cl.
*G06F 17/50* (2006.01)
(52) U.S. Cl. ............................ 716/111; 716/101; 716/104
(58) Field of Classification Search .................. 716/101, 716/104, 111
See application file for complete search history.

(56) References Cited

U.S. PATENT DOCUMENTS

| 7,257,786 B1 | 8/2007 | Kukula | |
|---|---|---|---|
| 2010/0083201 A1* | 4/2010 | Moon | 716/5 |

* cited by examiner

*Primary Examiner* — Thuan Do
(74) *Attorney, Agent, or Firm* — Bever, Hoffman & Harms, LLP; Jeanette S. Harms (57) ABSTRACT

A method of performing formal verification on a design for an integrated circuit can include accessing a set of constraints for the design. These constraints can be partitioned based on their variables, wherein any overlapping variables can result in the conjoining of their corresponding constraints. Binary decision diagrams (BDDs) can be generated based on such conjoining. Notably, invariants can be derived from the BDDs. These invariants can include constant, symmetric/implication, one-hot/zero-hot, and ternary invariants. Deriving the invariants can include cofactoring and counting of minterms of the BDDs. Using the invariants while performing formal verification on the design can advantageously optimize system performance.

16 Claims, 5 Drawing Sheets

| x | y | z | f |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 0 |
| 1 | 1 | 0 | 1 |
| 1 | 1 | 1 | 1 |

VERIFICATION TECHNIQUE INCLUDING DERIVING INVARIANTS FROM CONSTRAINTS

BACKGROUND OF THE INVENTION

1. Field of the Invention

The present invention relates to verification and in particular to deriving invariants from constraints using binary decision diagrams (BDDs), wherein such invariants can advantageously reduce system resources during formal verification.

2. Related Art

To determine the correctness of a design or a module (hereinafter called a design) for an integrated circuit, a set of constraints is generally used. As used herein, a "constraint" describes a variable or a relationship between two or more variables. Sets of constraints can be used for both simulation and for formal verification of a design.

Figure 1A:
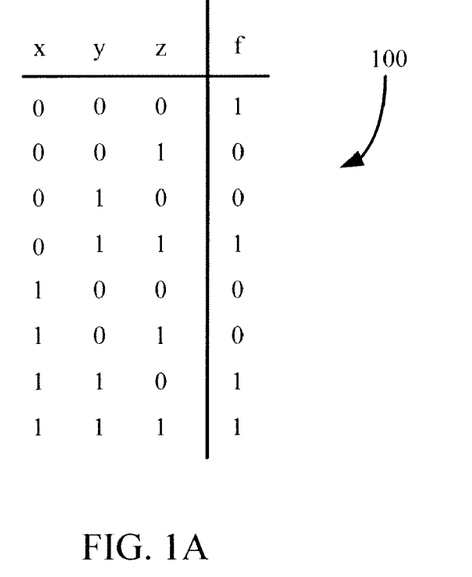
FIG. 1A illustrates an exemplary truth table.
Figure 1B:
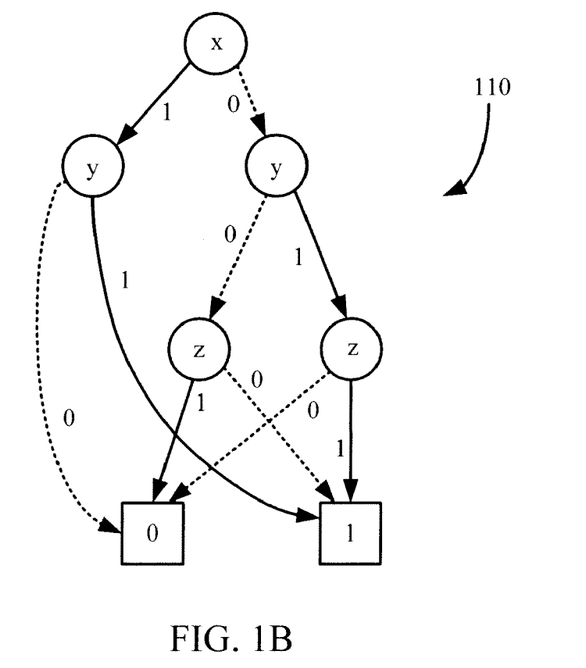
FIG. 1B illustrates a corresponding BDD for the truth table of FIG. 1A.

For example, by using constraint solving, the set of constraints can guide simulations to have only valid input values satisfying the constraints. In one known technique, totally random values can be assigned to the inputs of the design. By looking at the outputs of the design, invalid inputs can be identified and then eliminated from the set of constraints. For example, if outputs indicate that input A is always different than input B (i.e. A≠B), then the condition A=B can be eliminated from the set of constraints. This elimination process is called constrained random simulation. A binary decision diagram (BDD) is a data structure that can indicate the valid constraint combinations for a design. In one embodiment, a BDD can take the form of nested if-thens. In another embodiment, a BDD can take the form of a rooted, directed, acyclic graph that includes decision nodes (each decision node labeled by a Boolean variable) and two terminal nodes (0-terminal and 1-terminal). FIG. 1A illustrates an exemplary truth table 100. FIG. 1B illustrates a corresponding BDD 110 for the truth table 100. BDDs can be used during a subsequent simulation of the design.

In formal verification, constraints can be augmented with the design so that only valid transitions are considered in formal verification. Note that as used herein the term "formal verification" can include both logic design and functional verification as well as netlist verification. A "valid" transition means a transition from one state to another state by an input satisfying the constraints. Such transitions are typically associated with finite state machines (FSMs). In formal verification, all transitions of the design are considered at any point in time (which is called an implicit operation). That is, an individual transition of the design is not analyzed (which is called an explicit operation). In formal verification, any sets of invalid transitions are eliminated.

Notably, the design sizes that conventional formal verification can handle are small compared to those handled during simulation. For example, simulations can handle millions of registers, whereas formal verification typically only handles up to thousands of registers. Therefore, a need arises for a technique to more efficiently leverage constraint solving to improve the overall performance of formal verification.

SUMMARY OF THE INVENTION

In accordance with an improved method of performing formal verification on a design for an integrated circuit, a set of constraints for the design can be accessed (e.g. a set of constraints typically is given with the design). These constraints can be partitioned based on their variables, wherein any overlapping variables can result in the conjoining of their corresponding constraints. Binary decision diagrams (BDDs) can be generated based on such conjoining. Notably, invariants can be derived from the BDDs. These invariants can include constant invariants and symmetric/implication invariants. Using the invariants while performing formal verification on the design can advantageously optimize system performance.

In one embodiment, the invariants can include one-hot/zero-hot invariants, which can be derived from the symmetric/implication invariants. Deriving the constant invariants and the symmetric/implication invariants can include cofactoring of the BDDs. In another embodiment, the invariants can further include ternary invariants. Deriving the ternary invariants can include cofactoring and counting of minterms of the BDDs.

DETAILED DESCRIPTION OF THE FIGURES

In accordance with one improved aspect of formal verification, constraint solving can be advantageously used to improve performance of formal verification.

Figure 2:
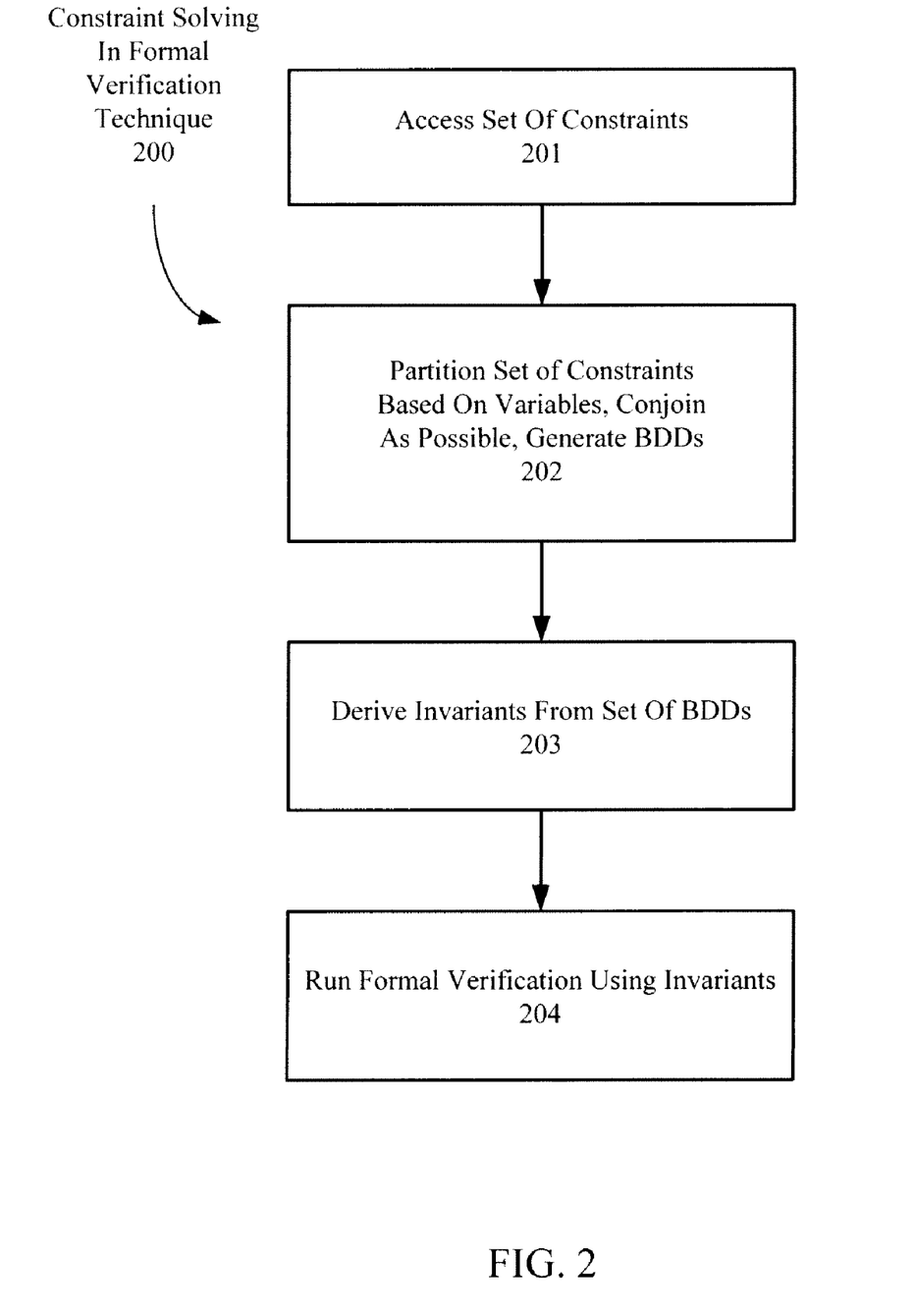
FIG. 2 illustrates an exemplary technique that uses constraint solving in formal verification.

FIG. 2 illustrates an exemplary technique 200 that uses constraint solving in formal verification. Step 201 accesses a set of constraints. This set of constraints C, which is typically provided with the design, is based on actual variables found in the design, e.g. $C=\{C_0, C_1, \ldots, C_{k-1}\}$, wherein k is an integer denoting the number of constraints. In a typical design, C may include hundreds of constraints. Note that at this point, the set of constraints C includes only true constraints.

In step 202, the set of constraints C can be partitioned so that each partition does not have any overlapping variables with the other partitions. Thus, for example, constraints a=0, a=b^c, and c=d are placed in the same partition because of their overlapping variables. At this point, BDDs can be built and conjoined as possible. Note that because of the non-overlapping aspect of the partitions, the conjoining of any BDDs can take place within a partition. Assuming that a system resource has not reached a predetermined threshold (thereby resulting in an abort of the conjoining), each partition will have one resulting BDD. In the case that the conjoining is aborted, a partition may have more than one BDD.

In one preferred embodiment, this conjoining can be performed until each BDD is disjointed to other BDDs based on their variables. For example, a first BDD could be formed for variables a, b, and c, whereas a second BDD could be formed for variables d, e, and f.

In other words, at the end of step 202, which can also be characterized as the end of constraint solving, a set of BDDs B can be built, e.g. $B=\{B_0, B_1, \ldots, B_{n-1}\}$, wherein n is an integer denoting the number of resulting BDDs associated with constraints C. Note that when conjoining is aborted, n>k. In contrast, when conjoined is completed, n=k and each $B_i$ can be characterized as the BDD of the i-th partition of the constraints. A typical design may include 10 BDDs; however, this number may vary considerably based on the actual design.

Step 203 can efficiently derive invariants from the resulting set of BDDs. As used herein, the term "invariant" refers to a valid relation among the variables in the design. Advantageously, disjointed BDDs can be analyzed in parallel in step 203, thereby providing significant processing efficiencies. Note that depending on available resources, step 202 may be interrupted such that the sets of preliminary BDDs are not conjoined yet. In this case, some sequential processing may be necessary in step 203 to derive the invariants. In one embodiment, when constraint solving takes longer than a predetermined time (e.g. 10 minutes), step 202 can be halted. Notably, the resulting set of BDDs, and thus its potentially partial list of invariants, can still provide system efficiency improvements in step 204. Referring back to FIG. 2, step 204 can run formal verification using the invariants derived in step 203.

Figure 3:
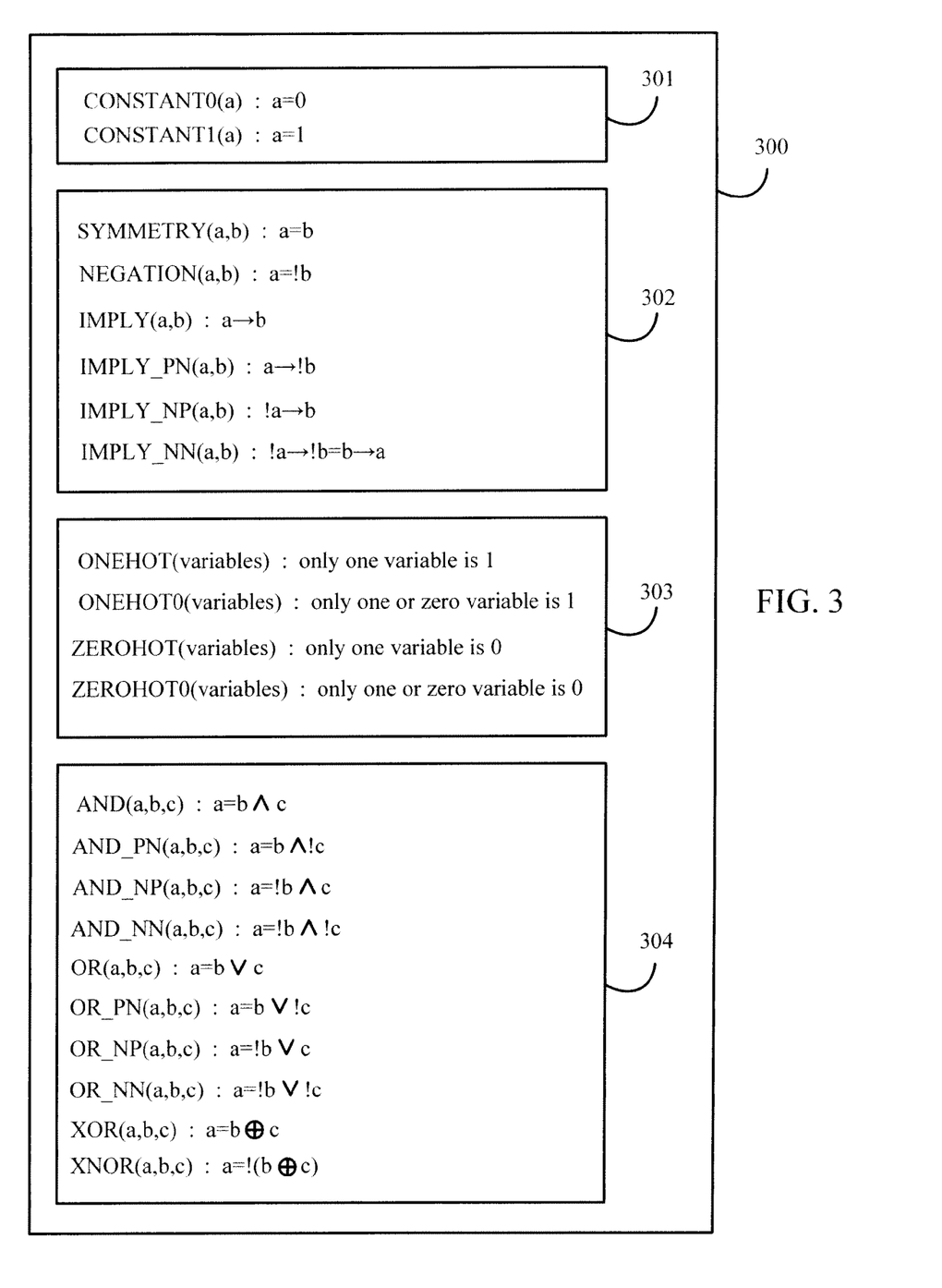
FIG. 3 illustrates a listing of exemplary invariants for up to three variables a, b, and c.

FIG. 3 illustrates a listing 300 of exemplary invariants for up to three variables a, b, and c. A first type of invariant, e.g. a constant invariant 301, describes a relationship for a variable in which that variable has only one logic value. A second type of invariant, e.g. a symmetric/implied invariant 302, describes a relationship in which a first variable equals or implies a second variable when the first variable equals a predetermined logic value. An exemplary implied invariant is if a=1, then b=1 (i.e. a→b) (and if a=0, then b=don't care). Another exemplary implied invariant is if a=0, then b=1 (i.e. !a→b) (and if a=1, then b=don't care). A third type of invariant, e.g. a onehot invariant 303, describes a relationship in which only one or zero variable of a set of variables is 1 (or 0). A fourth type of invariant, e.g. a ternary invariant 304, describes a relationship for a variable based on a Boolean operation of the other two variables.

In accordance with one aspect of improved formal verification, design invariants can be extracted from each BDD by using one or more BDD operations. Exemplary BDD operations include cofactoring, counting minterms, and finding relations between variables. Cofactoring sets a variable to a logic value and determines its validity in the BDD. A minterm is a product term in which each of n variables appears once (either complemented or uncomplemented). For example, xyz (x AND y AND z), xy'z (x AND NOT-y AND z), and xyz' (x AND y AND NOT-z) are exemplary minterms for a Boolean function of variables x, y, and z. The total number of possible minterms in a design is $2^n$, where n is the number of variables. Note that the number of minterms is effectively equal to the number of ones in a corresponding Karnaugh map.

Cofactoring, counting minterms, and finding relations between variables are explained in further detail below with respect to various pseudo code. Note that even though the below code processes 3 variables, the code in other embodiments can be extended to any number of variables.

The following pseudo code can be used in step 203 to extract/derive the above described invariants.

```
LearnFromBDDs(B) /*B = Π B_i (B_i is a BDD) */
    for (i = 0; i < n; i++) { /*n : # of BDDs */
        AnalyzeBDD(B_i);
    }
}
AnalyzeBDD(f) /* f: BDD */
{
```

```
    Essentials = FindEssentialVariables(f);
    Supports = GetSupports(Essentials);
    for (i = 0; i < c; i++) { /*c : # of supports */
        var1 = Supports[i];
        if (BddCofactor(Essentials, var1) == BDD_ZERO) {
            RegisterUnaryInvariant(CONSTANT0, var1);
            f = BddCofactor(f, BddNot(var1));
        } else {
            RegisterUnaryInvariant(CONSTANT1, var1);
            f = BddCofactor(f, var1);
        }
    }
    Supports = GetSupports(f);
    for (i = 0; i < m; i++) { /* m : # of supports */
        var1 = Supports[i];
        for (j = i + 1, j < m, j++) {
            var2 = Supports[j];
            type = FindBinaryRelation(f, var1, var2);
            if (type)
                RegisterBinaryInvariant(type, var1, var2);
        }
        type = FindTernaryRelation(f, var1, &var2, &var3);
        if (type)
            RegisterTernaryInvariants(type, var1, var2, var3);
    }
    AnalyzeOneHot( );
    AnalyzeZeroHot( );
}
```

As used in the above pseudo code, n is the number of BDDs and i is a first variable. In one embodiment, all types of invariants can be extracted from each BDD before analyzing the next BDD. The term "essential variable" refers to a variable in that BDD that has a single phase. Thus, for example, the above-cited function FindEssentialVariables( ) can be very fast because it traverses each BDD node only once and few variables are essential variables. The phase of each identified essential variables can then be determined, i.e. variable=0 or variable=1, by using cofactoring.

In one embodiment, as constant invariants are identified, the BDD is simplified, thereby minimizing the complexity of that BDD. The results of this process are captured and designated as "supports" (see, e.g. "Supports=GetSupports(Essentials)"). These supports can then be accessed by the next section of pseudo code (see, e.g. "Supports=GetSupports(f) "). In this pseudo code, m refers to the number of supports identified and j is a second variable (i being the first variable). In one embodiment, simplification of the BDD is not performed for other types of invariants, thereby facilitating a more complete analysis of the BDD. For example, if a=b=c=d=e, simplification performed after a=b would not allow subsequent identification of a=e.

In the above pseudo code, the constant invariants can be the first extracted invariants. In this embodiment of pseudo code, the symmetric, implication, ternary, and one-hot/zero-hot invariants can then be extracted. For ternary invariants, a first variable (var 1, e.g. a) can be analyzed for a ternary relationship with respect to second and third variables (var 2 and var 3, e.g. b and c). Note that all invariants are registered/saved (even the constants, which have already been replaced in the BDD) when they are identified.

The following pseudo code can be used to extract symmetric and/or implication invariants from the BDDs.

```
FindBinaryRelation(f, a, b)
{
    f_ab = BddCofactor(f, a ^ b);
    f_ab' = BddCofactor(f, a ^ !b);
```

-continued

```
f_{a'b} = BddCofactor(f, !a ^ b);
f_{a'b'} = BddCofactor(f, !a ^ !b);
zeroes = 0;
if (f_{ab} == BDD_ZERO) zeroes++;
if (f_{ab'} == BDD_ZERO) zeroes++;
if (f_{a'b} == BDD_ZERO) zeroes++;
if (f_{a'b'} == BDD_ZERO) zeroes++;
if (zeroes == 1) {
    if (f_{ab} == BDD_ZERO)
        type = IMPLY_PN;
    else if (f_{ab'} == BDD_ZERO)
        type = IMPLY;
    else if (f_{a'b} == BDD_ZERO)
        type IMPLY_NN;
    else
        type = IMPLY_NP;
} else if (zeroes == 2) {
    if (f_{ab'} == BDD_ZERO && f_{a'b} == BDD_ZERO)
        type = SYMMETRY;
    else
        type = NEGATION;
}
return(type);
}
```

In the above pseudo code, the lines $f_{ab}$, $f_{ab'}$, $f_{a'b}$, and $f_{a'b'}$ use cofactoring to set the variables a and b to either one or zero (e.g. for $f_{ab}$, a=1 and b=1; for $f_{a'b}$, a=0 and b=1).

At the end of this cofactoring, the number of resulting zeros from these operations can be counted. If the number of resulting zeros is 1, then the following invariants are present: a→!b (type=IMPLY_PN), a→b (type=IMPLY), !a→!b (type=IMPLY_NN), !a→b (type=IMPLY_NP). The specific invariant can be identified by determining which of the operations results in a zero. On the other hand, if the number of resulting zeros is 2, then either a=b (type=SYMMETRY) or a=!b (type=NEGATION). The specific invariant can be identified by determining whether the two operations $f_{ab'}$ and $f_{a'b}$ result in zeros. Note that if the number of resulting zeros is 3 or 4, then no symmetric or implication invariants are identified in the BDD.

The following steps can be used to extract OneHot/Zero-Hot invariants from the BDDs.

Note that IMPLY_PN(a, b) is functionally equivalent to ONEHOT0(a, b). Similarly, IMPLY_NP(a, b) is functionally equivalent to ZEROHOT0(a, b). Notably, these relationships can be extended for more than two variables. Specifically, in accordance with one embodiment, one-hot invariants can be found from a set of IMPLY_PN invariants that are already found and zero-hot invariants can be found from a set of IMPLY_NP invariants. Thus, extracting the one-hot/zero-hot invariants is a post-processing step that can be performed after the extraction of the implication invariants.

Figure 4:
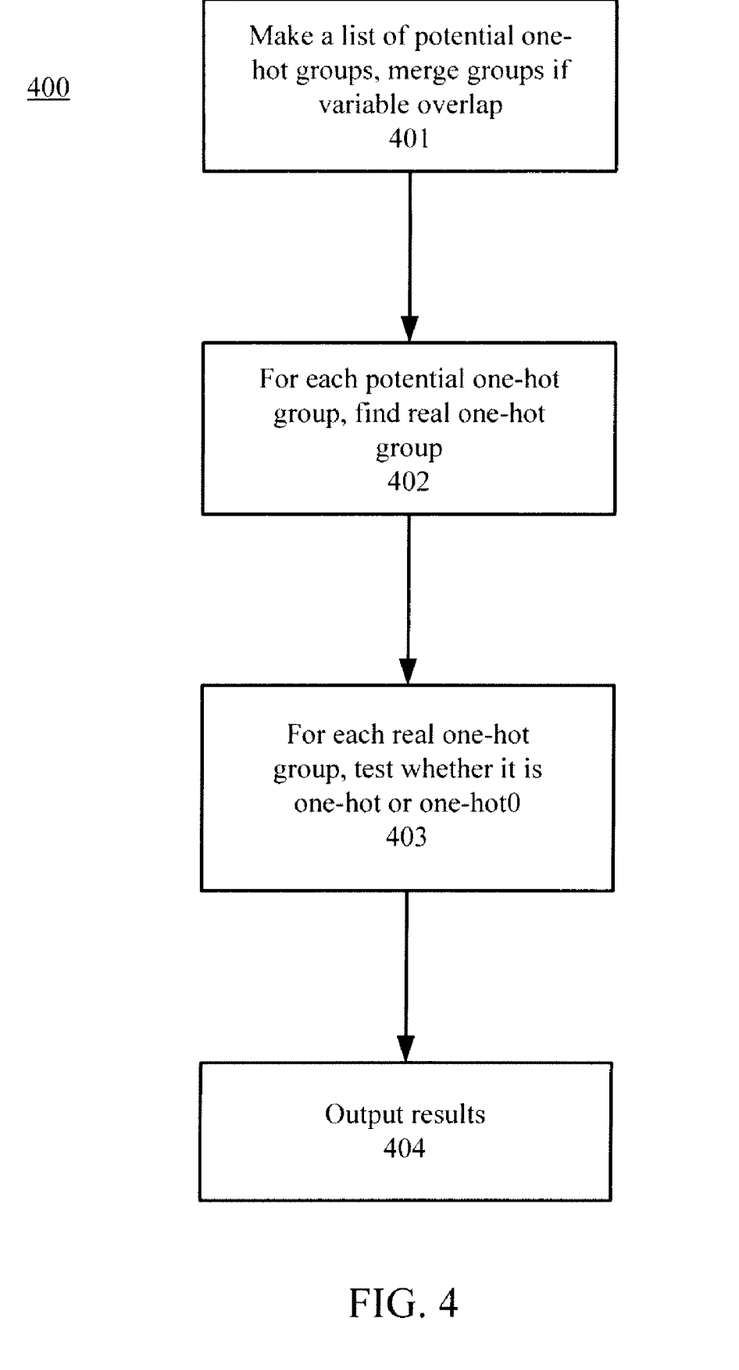
FIG. 4 illustrates an extraction technique for one-hot invariants.

FIG. 4 illustrates an extraction technique 400 for one-hot invariants. Step 401 can make a list of potential one-hot groups. In one embodiment, all IMPLY_PN invariants for all variables can be listed. Then, groups can be iteratively merged if there is any overlapping variable. After such merging, any group having less than three variables is deleted and any group having more than two variables is considered a potential one-hot group.

At this point, for each potential one-hot group, step 402 can find real one-hot groups. To be a real one-hot group, for each pair-wise variables (p, q) in the group, the variables (p, q) must have an IMPLY_PN(p, q) relation. For each real one-hot group, step 403 can test whether the real one-hot group is one-hot (in which only one variable can be one) or one-hot0 (in which only one variable or no variable can be one). In one embodiment, to perform this test, the constraint can be evaluated by setting all variables in the group to BDD_ZERO. If the evaluation becomes BDD_ZERO, then the one-hot group is an ONEHOT, otherwise it is an ONEHOT0. Note that extracting zero-hot invariants can be extracted in a similar manner as indicated above except that the IMPLY_NO invariants can be used instead of the IMPLY_PN invariants. Step 404 can output the results of at least step 403.

The following pseudo code can be used to extract ternary invariants from the BDDs.

```
FindTernaryRelation(f, a, *b, *c)
{
    f_a = BddCofactor(f, a);
    abs = BddExist(f, a);
    phi = BddMinimize(f, abs)
    if (BddSize(phi) < 4) {
        nvars = BddSupportSize(phi);
        if (nvars == 2) {
            supports = BddSupports(phi);
            *b = supports[0];
            *c = supports[1];
            minterms = BddMinterms(phi);
            if(minterms == 1) {
                f_b = BddCofactor(phi, *b);
                f_c = BddCofactor(phi, *c);
                if (f_b == BDD_ZERO) {
                    if (f_c == BDD_ZERO) type = AND_NN;
                    else type = AND_NP;
                } else {
                    if (f_c == BDD_ZERO) type = AND_PN;
                    else type = AND;
                }
            } else if (minterms == 2) {
                if (BddIsComplement(phi)) type = XOR;
                else type = XNOR;
            } else if (minterms == 3) {
                f_b = BddCofactor(phi, *b);
                f_c = BddCofactor(phi, *c);
                if (f_b == BDD_ONE) {
                    if (f_c == BDD_ONE) type = OR;
                    else type = OR_PN;
                } else {
                    if (f_c == BDD_ONE) type = OR_NP;
                    else type = OR_NN;
                }
            }
        }
    }
    return(type);
}
```

Note that in the above pseudo code, a is an input variable, whereas b and c are associated inputs (indicated by the *) of variable a. The line "$f_a$=BddCofactor(f,a)" indicates that the cofactoring results with respect to variable a=1 should be accessed. The line "abs=BddExist(f,a)" refers to another set of results can be accessed, wherein these results are the union of a=1 and a=0. The line "phi=BddMinimize($f_a$,abs)" refers to—a way to find a functional dependency from the function "f" with respect to the given variable "a". If "phi" is not empty, the variable "a" in "f" can be represented by "phi". This computing of "phi" is a known by those skilled in the art and therefore is not described in detail herein. However, because the size of "phi" could be large in terms of both BDD size and the number of supports, one aspect of the invention in the above pseudo code can advantageously restrict the size of "phi" to a small size so that simple, but powerful invariants can be generated.

To limit the ternary relationships to three variables, the line "if (BddSize(Phi)<4" can be provided. If the number of variables (nvars) is equal to 2, then the process proceeds, otherwise no ternary invariants can be found ("if (nvars==2)"). In this case, b is the first support and c is the second support. At this point, the number of minterms in phi can be counted. If the number of minterms is 1, then an AND-type invariant can be identified (i.e. AND, AND_PN, AND_NP, or AND_NN). If the number of minterms is 2, then an XOR or an XNOR invariant can be identified. If the number of minterms is 3, then an OR-type invariant can be identified (i.e. OR, OR_PN, OR_NP, or OR_NN). Note that once the number of minterms is determined, then cofactoring can be used to specifically identify the AND and OR invariants. Further note that although ternary invariants are described above, other embodiments of the invention can be extended to any size of relations (i.e. at least ternary invariants).

Advantageously, learning from the constraints can significantly decrease the run-time of formal verification. For example, typical designs can experience up to a 5× speed-up in verification run-time. This learning can include simplifying the netlist of the design under verification (DUV). For example, variables with constant, symmetric, and ternary invariants can be eliminated (e.g. if a=1, then all instances of a can be replaced with "1"; if b=c, then all instances of b can be replaced with c; and if a=b^c, then all instances of a can be replaced with b^c (i.e. an AND gate with inputs of b and c)).

Invariants can also advantageously be easily used in a SAT-based engine (wherein SAT refers to Standard ACIS Text). A SAT-based engine can determine a solution based on certain outputs from the design. In one embodiment of a SAT-based engine, CNF (i.e. conjunctive normal form) clauses, which are conventional inputs, can also represent invariants. Advantageously, the SAT-based engine can exclude certain invalid combinations based on such additional CNF clauses.

Learning from constraints can also advantageously minimize the transition relations in a BDD-based engine with respect to the identified invariants. Advantageously, the BDD-based engine can exclude certain invalid transitions based on the identified invariants. Note that, in general, for either the SAT-based engine or the BDD-based engine, the simplified netlist can significantly reduce complexity, thereby facilitating the exclusion of invalid decisions/transitions.

Figure 5:
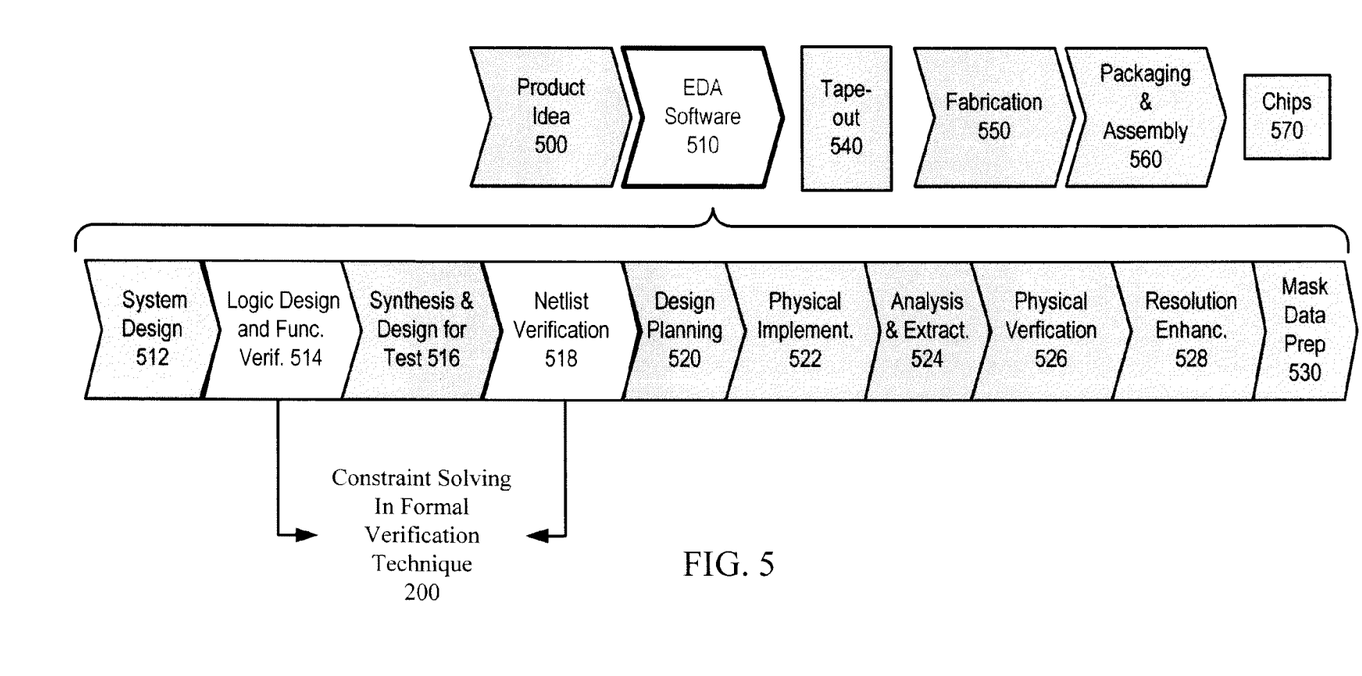
FIG. 5 shows a simplified representation of an exemplary digital ASIC design flow.

FIG. 5 shows a simplified representation of an exemplary digital ASIC design flow. At a high level, the process starts with the product idea (step 500) and is realized in an EDA software design process (step 510). When the design is finalized, it can be taped-out (event 540). After tape out, the fabrication process (step 550) and packaging and assembly processes (step 560) occur resulting, ultimately, in finished chips (result 570).

The EDA software design process (step 510) is actually composed of a number of steps 512-530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 510) will now be provided:

System design (step 512): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

Logic design and functional verification (step 514): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products. In one embodiment, the above-described constraint solving technique 200 can be implemented in step 514.

Synthesis and design for test (step 516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

Netlist verification (step 518): At this step, the netlist is checked for compliance with timing constraints and for correspondence with the VHDL/Verilog source code. Exemplary EDA software products from Synopsys, Inc. that can be used at this step include Formality, PrimeTime, and VCS products. In one embodiment, the above-described constraint solving technique 200 can be implemented in step 518.

Design planning (step 520): Here, an overall floorplan for the chip is constructed and analyzed for timing and top-level routing. Exemplary EDA software products from Synopsys, Inc. that can be used at this step include Astro and IC Compiler products.

Physical implementation (step 522): The placement (positioning of circuit elements) and routing (connection of the same) occurs at this step. Exemplary EDA software products from Synopsys, Inc. that can be used at this step include the Astro and IC Compiler products.

Analysis and extraction (step 524): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 526): At this step, various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 528): This step involves geometric manipulations of the layout to improve manufacturability of the design. Exemplary EDA software products from Synopsys, Inc. that can be used at this step include Proteus, ProteusAF, and PSMGen products.

Mask data preparation (step 550): This step provides the "tape-out" data for production of masks for lithographic use to produce finished chips. Exemplary EDA software products from Synopsys, Inc. that can be used at this step include the CATS® family of products.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, an apparatus of the invention can be implemented in a computer program product (e.g. instructions) tangibly embodied in a machine-readable storage device (e.g. a computer-readable medium) for execution by a programmable processor (e.g. a computer). Thus, the above-described methods of the invention can be performed by a programmable processor executing a program of instructions to perform functions of the invention by operating on input data and generating output data. Accordingly, it is intended that the scope of the invention be defined by the following Claims and their equivalents.

The invention claimed is:

1. A method of performing formal verification on a design for an integrated circuit, the method comprising:
    accessing a set of constraints for the design;
    using a computer, deriving invariants from a plurality of binary decision diagrams (BDDs) generated from the set of constraints, the invariants including constant invariants, symmetric invariants, implication invariants, and ternary invariants, wherein disjointed BDDs are analyzed in parallel and non-conjoined BDDs are analyzed at least partially sequentially with a remainder in parallel; and
    performing formal verification on the design using the invariants, wherein using the invariants includes at least one of simplifying a netlist of the design and minimizing transition relations in a BDD-based engine.

2. The method of claim 1, wherein deriving invariants includes cofactoring and counting minterms of the BDDs.

3. The method of claim 1, wherein the invariants include one-hot/zero-hot invariants derived from the symmetric and implication invariants.

4. The method of claim 1, wherein all types of invariants are extracted from each BDD before analyzing a next BDD.

5. The method of claim 1, wherein deriving constant invariants includes cofactoring of the BDDs.

6. The method of claim 1, wherein deriving symmetric and implication invariants includes cofactoring of the BDDs.

7. The method of claim 1, wherein deriving ternary invariants includes cofactoring and counting minterms of the BDDs.

8. The method of claim 1, further including:
    partitioning the set of constraints based on variables, conjoining any constraints based on overlapping variables, and generating binary decision diagrams (BDDs) based on the conjoining, wherein an overlapping variable is a same variable present in at least two constraints.

9. A non-transitory, computer-readable medium storing computer-executable instructions for formal verification of a design for an integrated circuit, the instructions when executed by a programmable processor performing steps of:
    accessing a set of constraints for the design;
    deriving invariants from a plurality of binary decision diagrams (BDDs) from the set of constraints, the invariants including constant invariants, symmetric invariants, implication invariants, and ternary invariants, wherein disjointed BDDs are analyzed in parallel and non-conjoined BDDs are analyzed at least partially sequentially with a remainder in parallel; and
    performing formal verification on the design using the invariants, wherein using the invariants includes at least one of simplifying a netlist of the design and minimizing transition relations in a BDD-based engine.

10. The computer-readable medium of claim 9, wherein deriving invariants includes cofactoring and counting minterms of the BDDs.

11. The computer-readable medium of claim 9, wherein the invariants include one-hot/zero-hot invariants derived from the symmetric and implication invariants.

12. The computer-readable medium of claim 9, wherein all types of invariants are extracted from each BDD before analyzing a next BDD.

13. The computer-readable medium of claim 9, wherein deriving constant invariants includes cofactoring of the BDDs.

14. The computer-readable medium of claim 9, wherein deriving symmetric and implication invariants includes cofactoring of the BDDs.

15. The computer-readable medium of claim 9, wherein deriving ternary invariants includes cofactoring and counting minterms of the BDDs.

16. The computer-readable medium of claim 9, further including:
    partitioning the set of constraints based on variables, conjoining any constraints based on overlapping variables, and generating binary decision diagrams (BDDs) based on the conjoining, wherein an overlapping variable is a same variable present in at least two constraints.

* * * * *

UNITED STATES PATENT AND TRADEMARK OFFICE
CERTIFICATE OF CORRECTION

PATENT NO.        : 8,156,462 B2                                Page 1 of 1
APPLICATION NO.   : 12/243821
DATED             : April 10, 2012
INVENTOR(S)       : Moon

It is certified that error appears in the above-identified patent and that said Letters Patent is hereby corrected as shown below:

In the Claims

Column 9, Claim 2
Line 21, insert --the-- before "deriving".

Column 10, Claim 10
Line 16, insert --the-- before "deriving".

Signed and Sealed this
Seventh Day of January, 2014

Margaret A. Focarino
*Commissioner for Patents of the United States Patent and Trademark Office*